US010011723B2

(12) United States Patent
Papakonstantinou (10) Patent No.: US 10,011,723 B2
(45) Date of Patent: Jul. 3, 2018

(54) ANTI-CORROSION COATINGS (71) Applicant: University of Ulster, County Londonderry (GB)

(72) Inventor: Pagona Papakonstantinou, Newtownabbey Antrim (GB)

(73) Assignee: UNIVERSITY OF ULSTER, Coleraine, County Londonderry (GB)

( * ) Notice: Subject to any disclaimer, the term of this patent is extended or adjusted under 35 U.S.C. 154(b) by 100 days.

(21) Appl. No.: 14/439,307

(22) PCT Filed: Oct. 29, 2013

(86) PCT No.: PCT/EP2013/072653
§ 371 (c)(1),
(2) Date: Apr. 29, 2015

(87) PCT Pub. No.: WO2014/067972
PCT Pub. Date: May 8, 2014

(65) Prior Publication Data
US 2015/0247041 A1  Sep. 3, 2015

(30) Foreign Application Priority Data

Oct. 29, 2012  (GB) .................................. 1219417.1

(51) Int. Cl.
C09D 5/08  (2006.01)
C23C 16/26  (2006.01)
C01B 32/186  (2017.01)

(52) U.S. Cl.
CPC ............ *C09D 5/084* (2013.01); *C01B 32/186* (2017.08); *C23C 16/26* (2013.01); *C01B 2204/04* (2013.01); *C01B 2204/30* (2013.01); *Y10T 428/24975* (2015.01); *Y10T 428/30* (2015.01)

(58) Field of Classification Search
None
See application file for complete search history.

(56) References Cited

U.S. PATENT DOCUMENTS

| 2006/0216222 A1* | 9/2006 | Jang ...................... B82Y 30/00 423/448 |
| 2010/0203340 A1* | 8/2010 | Ruoff ........................ C23C 8/64 428/408 |
| 2011/0151278 A1 | 6/2011 | Gurney et al. |
| 2012/0161192 A1 | 6/2012 | Kim et al. |
| 2012/0261167 A1* | 10/2012 | Sung ...................... H01L 29/45 174/254 |

FOREIGN PATENT DOCUMENTS

CN  102605339 A    7/2012
WO  WO2008084951 A  *  7/2008
(Continued)

OTHER PUBLICATIONS

Abbas et al. "The improvement in gas barrier performance and optical transparency of DLC-coated polymer by silicon incorporation," Thin Solid Films. 482:201-206 (2005).
(Continued)

*Primary Examiner* — Tahseen N Khan
(74) *Attorney, Agent, or Firm* — Clark & Elbing LLP (57) ABSTRACT

A coating comprising silicon-doped graphene layers wherein the graphene is in the form of horizontally-aligned graphene nanosheets.

22 Claims, 9 Drawing Sheets

SEM image of vertical graphene nanoflakes showing a network morphology (56) References Cited

FOREIGN PATENT DOCUMENTS

| WO | WO-2012/064102 A2 | 5/2012 |
|---|---|---|
| WO | WO-2012/118350 A2 | 9/2012 |
| WO | WO-2013/003083 A1 | 1/2013 |

OTHER PUBLICATIONS

Azadeh et al., "Tunable bandgap opening in the proposed structure of silicon doped graphene," Micro Nano Lett. 582-585 (2011).
Brenner et al., "Single step, complementary doping of graphene," Appl Phys Lett. 96:063104-1-063104-3 (2010).
Bunch et al., "Impermeable atomic membranes from graphene sheets," Nano Lett. 8(8):2458-2462 (2008).
Campos-Delgado et al., "Chemical vapor deposition synthesis of N-, P-, and Si-doped single-walled carbon nanotubes," ACS Nano. 4(3):1696-1702 (2010).
Chen et al., "Oxidation resistance of graphene-coated Cu and Cu/Ni alloy," ACS Nano. 5(2):1321-1327 (2011).
Chen et al., "Si-doped graphene: an ideal sensor for NO- or NO2-detection and metal-free catalyst for N2O-reduction," J Mol Model. 18(5):2043-2054 (2012).
Cho et al., "Atomic-scale investigation of graphene grown on Cu foil and the effects of thermal annealing," ACS Nano. 5(5):3607-3613 (2011).
Kirkland et al., "Exploring graphene as a corrosion protection barrier," Corrosion Science 56:1-4 (2012).
Lounis et al., "Resonant photoluminescent charging of epitaxial graphene," Appl Phys Lett 96:151913-1-151913-3 (2010).
Okpalugo et al., "Platelet adhesion on silicon modified hydrogenated amorphous carbon films," Biomaterials 25:239-245 (2004).
Pao et al., "Change of structural behaviors of organo-silane exposed graphene nanoflakes," J Phys Chem C. 114(18):8161-8166 (2010).
Papakonstantinou et al., "The effects of Si incorporation on the electrochemical and nanomechanical properties of DLC thin films," Diam Relat Mater. 11:1074-1080 (2002).
Papakonstantinou et al., "Evaluation of corrosion performance of ultra-thin Si-DLC overcoats with electrochemical impedance spectroscopy," Diam Relat Mater. 11:1124-1129 (2002).
Prasai et al., "Graphene: corrosion-inhibiting coating," ACS Nano. 6(2):1102-1108 (2012) (7 pages).
Shang et al., "Catalyst-free efficient growth, orientation and biosensing properties of multilayer graphene nanoflake films with sharp edge planes," Adv. Funct. Mater. 18:3506-3514 (2008).
Topsakal et al., "Graphene coatings: an efficient protection from oxidation," Physical Review B 85:155445-1-155445-7 (2012).
International Search Report for International Application No. PCT/EP2013/072653, dated Jan. 24, 2014 (4 pages).
Written Opinion of the International Searching Authority for International Application No. PCT/EP2013/072653, dated Jan. 24, 2014 (7 pages).

* cited by examiner

SEM image of vertical graphene nanoflakes showing a network morphology

FIG. 1

(a) and (b) Different magnification TEM images of MGNFs; (c) High resolution TEM image of CNFs, showing the nanoflake has a knife-edge or conical tip structure with open graphitic planes, where the thicker base progressively terminates in a few graphene layers. The inset of (c) is an EDS spectrum showing the chemical composition of MGNF films.

FIG. 2A - FIG. 2C

Polarization curves after 1 h immersion for clean and annealed copper

FIG. 3

Polarization curves after 1 h immersion for annealed copper, graphene (G) and silicon incorporated graphene (G:Si 3 sccm TMS) coated copper foils.

FIG. 4

Optical photos of (a) bare copper, (b) graphene Silicon incorporated and c) graphene coatings of copper foils after annealing at 200°C for 1 hour.

SEM images of (a) bare Cu foil after annealing at 200C for 1 hour (b) Silicon doped graphene on cupper foil before and c) after annealing at 200C for 1 hour

FIG. 6C

Raman spectra of (a) graphene and (b) Silicon incorporated graphene coated on Copper before and after annealing in air at 200°C for 1 hour

Impedance (8a) Nyquist (8b) and Bode (8c) plots of graphene and Silicon incorporated graphene coated on Cupper foil

FIG. 8C

ANTI-CORROSION COATINGS

FIELD OF THE INVENTION

The present invention relates to protective coatings, specifically to protective silicon-doped graphene coatings for use on metals, their production and uses. The invention also relates to a method of inhibiting corrosion comprising the formation of said coatings and the use of said coatings in the inhibition of corrosion, particularly in the reduction of oxidative corrosion.

BACKGROUND

The development of active corrosion protection systems for metallic substrates is an issue of prime importance for many industrial applications. The use of refined metals is widespread, but such metals can frequently be chemically reactive, limiting their use or requiring protective coatings. Protecting the surface of such metals has developed into a significant industry.

Corrosion of metals is a significant destructive process, resulting in huge economic losses, especially in the aerospace, automotive, and petroleum industries. An intense effort is underway to find coatings that inhibit the process of metal corrosion, a problem costing US industries more than $200 billion annually.

Conventional approaches to protecting metal surfaces can include organic coatings, paints, varnishes, polymer coatings, formation of oxide layers, anodisation, chemical modification, such as the formation of thiol and/or sulphate layers, and coating, for example via electroplating, with other metals or alloys. Such conventional approaches suffer from a variety of limitations, such as susceptibility to heat damage, necessity of thick coatings, cost, formation of waste products, etc. Thus, there is a need to address the aforementioned problems and other shortcomings associated with traditional metals and coatings.

Corrosion can be inhibited or controlled by introducing a stable protective layer made of inert metals, conductive polymers, or even thiol-based monolayers between a metal and a corrosive environment. However, these protective coatings have their limitations.

Thiolated self-assembled monolayers (SAMs) can only be assembled onto some metals (e.g., gold and copper) and do not withstand temperatures higher than ~100° C. Polymeric coatings are relatively thick and may significantly change the physical properties of the underlying material. Polymer or sol-gel coatings are normally applied on the metal surface providing a barrier for permeation of corrosive species. However, when the barrier is damaged and the corrosive agents penetrate the metal surface the coating system cannot stop the corrosion process.

At present the most effective anti-corrosion coatings for active protection of metals are chromate-containing systems. However, this product is well-known to be toxic and carcinogenic and is now prohibited on end products and highly regulated on industrial lines by European Community directives (VUH and RoHS).

Therefore, there has been an extensive search for green and human safe anti-corrosion treatments. These smart coatings must be able to deal with local pH changes in the corrosive area but also be able to prevent interactions of corrosive species such as water, chlorine ions and/or oxygen, with the metal surface.

Graphene, a single atomic monolayer of graphite, has properties which are well suited to corrosion-inhibiting coatings in applications such as microelectronic components (e.g. interconnects, aircraft components, and implantable devices). Graphene is chemically inert, stable in ambient atmosphere up to 400° C., and can be grown on the meter-scale and mechanically transferred onto arbitrary surfaces. Single-layer graphene films and films consisting of a few layers of graphene have good transparency, so thin graphene coatings, for example having up to 4 layers of graphene, do not significantly affect the optical properties of the underlying metal.

Recently, Bunch et al. [Bunch, J. S.; Verbridge, S. S.; Alden, J. S.; van der Zande, A. M.; Parpia, J. M.; Craighead, H. G.; McEuen, P. L Impermeable Atomic Membranes from Graphene Sheets, *Nano Lett.* 2008, 8, 2458-2462] have shown that single-atomic graphene films are impermeable to gas molecules. Chen et al. [Chen, S.; Brown, L.; Levendorf, M.; Cai, W.; Ju, S. Y.; Edgeworth, J.; Li, X.; Magnuson, C. W.; Velamkanni, A.; Piner, R. D. "Oxidation Resistance of Graphene-Coated Cu and Cu/Ni Alloy" *ACS Nano* 2011, 5, 1321-1327] have demonstrated that graphene can inhibit oxidation of the underlying copper metal. Prasai et al. [Prasai, D.; Tuberquia, J. C.; Harl, R. R.; Jennings J. K.; Bolotin, K. I.; "Graphene: Corrosion-Inhibiting Coating" *ACS Nano*, 2012, 6, 1102-1108] have demonstrated that graphene films can serve as corrosion-inhibiting coatings. US 2011/0151278 discloses magnetic devices/media having a graphene overcoat, while US 2010/0203340 is directed to protective carbon coatings, namely protective graphene coatings.

However, the existing graphene-coating technology has drawbacks. For example, the growth and/or transfer processes of graphene inevitably result in pinholes, defects or cracks in the film. This causes problems with corrosion, for example oxidative corrosion, at edges, defects and/or grain boundaries. For example, the metal substrate corrodes under the coating at points where there are pinholes in the graphene film. Efforts to solve these problems have so far concentrated on improvements in growth techniques and transfer techniques.

In addition, there is a need for protective coatings which can be thicker than a few layers while maintaining excellent transparency.

For applications in magnetic devices, there is a need to reduce the thickness of the current protective coatings to less than 1 nm thickness while maintaining the overall mechanical strength and its corrosion protection, in order to increase the magnetic recording density.

Silicon-doping has the potential to be used as an effective method for opening the band gap of graphene. Chemically silicon-doped graphene results in an energy gap as large as 2 eV according to density-functional theory (DFT) calculations. (Azadeh M. S. S.; Kokabi A.; Hosseini M.; Fardmanesh M.; "Opening in the Proposed Structure of Silicon Doped Graphene", *Micro Nano Lett.* 2011, 582-585).

Modelling studies indicate that Si-doped graphene has the potential to detect or reduce harmful nitrogen oxides. While adsorption of the three nitrogen oxide molecules on pristine graphene is very weak, Si-doping enhances the interaction of these molecules with the graphene sheet (Chen Y.; Gao B.; Zhao J. X.; Cai Q. H.; Fu H. G; "Si-doped graphene: an ideal sensor for NO- or $NO_2$-detection and metal-free catalyst for $N_2O$-reduction" *J. Mol. Model.* 2012, 18, 2043-2054).

Si doping has also the potential to increase the photoluminescence of graphene (Lounis S. D.; Siegel D. A.; Broesler R.; Hwang C. G.; Haller E. E.; Lanzara A. "Resonant photoluminescent charging of epitaxial graphene", *Appl. Phys. Lett.* 2010, 96, 151913).

The current invention provides a silicon-doped graphene coating with enhanced corrosion inhibition, transparency and/or gas barrier properties. The coatings of the current invention also exhibit self-healing properties. The formation of a passivation layer, which fills the pores present in the films leads to improvements in corrosion resistance. Doping with silicon also improves the transparency and therefore will allow the formation of thicker layers where protection with a transparent coating is important.

A further potential advantage of the Si doped graphene coating is an enhancement of the bio- and hemo-compatibility. This has not previously been demonstrated in graphene although an advantage has been observed for Si doped Diamond Like Carbon, DLC (Okpalugo T. I. T.; Ogwu A. A.; Maguire P. D.; McLaughlin J. A. D. "Platelet adhesion on silicon modified hydrogenated amorphous carbon films". Biomaterials 2004; 25, 239.)

Silicon-doped graphene offers a unique combination of properties that are ideal for corrosion-inhibiting coating in applications such as microelectronic components. For example it could be used on the copper interconnects in computer chips, implantable medical devices, high-tech equipment (aerospace, super cars, and so on), or designer goods, where silicon-doped graphene's negligible size and weight, and improved transparency would be highly desirable.

SUMMARY OF THE INVENTION

The present invention relates to the development of new coating materials, metal substrates comprising said coatings, and methods for their preparation and use.

Viewed from a first aspect the invention thus provides a coating comprising and optionally consisting of silicon-doped graphene layers wherein the graphene is in the form of horizontally-aligned graphene nanosheets (as defined herein). Preferably the coatings of the invention comprise graphene nanosheets having a planar morphology.

In one aspect of the invention the coatings may comprise or consist of a single monoatomic silicon-doped graphene layer or may comprise more than one layer of silicon-doped graphene nanosheets. Preferably the number of layers may be in the range 1 to 10, more preferably 1 to 5 layers. Most preferably the coatings may comprise 1 to 3 layers, for example 2 layers.

The coatings of the invention preferably have a single-layer thickness in the range 0.31 to 0.35 nm, preferably 0.33 to 0.34 nm, more preferably approximately 0.335 nm.

The total thickness of the coating may be in the range 0.3 to 3.5 nm, for example 0.33 to 3.40 nm, preferably 0.335 nm to 3.35 nm. Preferably the total thickness of the coating may be in the range 0.335 to 1.7 nm. More preferably the total thickness of the coating may be less than 1 nm, for example 0.3 to 0.9 nm, preferably 0.3 to 0.7 nm, for example 0.33 to 0.67 nm.

Preferably the coatings of the invention comprise 1 to 60 at. % Si. More preferably the coatings comprise 10 to 30 at. % Si. The coatings of the invention may comprise a second non-metallic hetero-atom dopant, which is not oxygen. Preferably said second dopant can be nitrogen. Preferably said silicon dopant is incorporated into the crystal lattice of the graphene. If a second hetero-atom dopant is present, it is preferred if this is incorporated into the crystal lattice of the graphene. It is more preferred if both said silicon dopant and said second dopant are incorporated into the crystal lattice of the graphene.

Preferably the coatings of the invention are metal-free.

The coatings of the invention may cover at least 50%, preferably at least 80%, more preferably at least 95%, of the surface area of the substrate. Most preferably at least 99% of the surface area of the metal is coated. It is particularly preferred if the coating covers essentially all the surface of the metal except for pinholes and cracks. Preferably said substrate can be a metal substrate. It is preferred if the substrate is selected from the group consisting of Al, Aluminium alloys (e.g. Al—Mg), Cu, Ni, Co, Fe, Ti, steel, magnesium alloys, and metal alloys.

The Si-doped graphene coatings of the invention may have a higher charge transfer resistance than those of pure graphene coatings. The silicon incorporation is expected to induce i) a lower corrosion current density and a more positive corrosion potential and ii) an increase of the electrochemical impedance modulus and charge transfer compared to the undoped graphene coating (see for example FIG. 4).

Viewed from another aspect, the invention provides a coated metal wherein at least a portion of the metal surface comprises a silicon-doped graphene coating as herein defined. Preferably at least 50%, preferably at least 80%, more preferably at least 95%, of the surface area of the metal is coated. Most preferably at least 99% of the surface area of the metal is coated. It is particularly preferred if the coating covers essentially all the surface of the metal except for pinholes and cracks. Preferably the metal is selected from the group consisting of Al, Aluminium alloys (e.g. Al—Mg) Cu, Ni, Co, Fe, Ti, steel, magnesium alloys, and metal alloys.

Viewed from another aspect, the invention provides a process for the production of a silicon-doped graphene coating as defined herein, comprising "one step" chemical vapour deposition (thermal CVD or microwave plasma enhanced CVD) or a "two step" process i.e. CVD growth of graphene followed by post-growth functionalisation of graphene with Si. In the "one step" process Si-doped graphene may be obtained through direct deposition. In the "two step" process a graphene layer may be grown as a first step, followed by doping with silicon by, for example, plasma treatment. It is an aspect of the invention that the "one step" process for production of the silicon-doped graphene coatings defined herein may simultaneously produce SiC phases, or mixed SiC and Si-doped graphene coatings. Preferably the coatings produced will comprise at least 50% Si-doped graphene, more preferably at least 75%, most preferably at least 90% Si-doped graphene.

Viewed from another aspect, the invention provides a method of inhibiting corrosion of a metal, said method comprising forming a coating as defined herein on at least a portion of the surface of said metal. Preferably at least 50%, preferably at least 80%, more preferably at least 95%, of the surface area of the metal is coated. Most preferably at least 99% of the surface area of the metal is coated. It is particularly preferred if the coating covers essentially all the surface of the metal except for pinholes and cracks. Preferably the metal is selected from the group consisting of Al, Aluminium alloys (e.g. Al—Mg) Cu, Ni, Co, Fe, Ti, steel, magnesium alloys, and metal alloys.

Viewed from another aspect, the invention provides for the use of silicon-doped graphene as a coating for the reduction of corrosion, preferably oxidative corrosion, at the surface of a metal. Preferably the corrosion-inhibiting coating is as defined herein.

DETAILED DESCRIPTION OF THE INVENTION

The present invention relates to coatings, their uses, methods of formation and other aspects wherein a doped graphene is utilised. The term "graphene" is used herein to refer to a single-atom-thick planar sheet of $sp^2$-bonded carbon atoms which are positioned in a honeycomb crystal lattice.

Morphology of Nanostructures

Graphene is an atomically thin single layer of carbon atoms arranged in a hexagonal lattice and lying parallel to a substrate. The current invention relates to doped graphene nanosheets. The term "nanosheet" as used herein is defined to mean a two-dimensional structure lying parallel to a substrate. The graphene nanosheets of the invention differ from nanorods, nanotubes, nanoflakes and nanowalls by means of their morphology and/or orientation.

Nanorods are solid and elongated, having dimensions in the range of approximately 1-100 nm. Standard aspect ratios for nanorods (length divided by width) are 3-5. Nanotubes are generally hollow, cylindrical nanostructures having a length to diameter ratio of up to 132,000,000:1.

Figure 1:
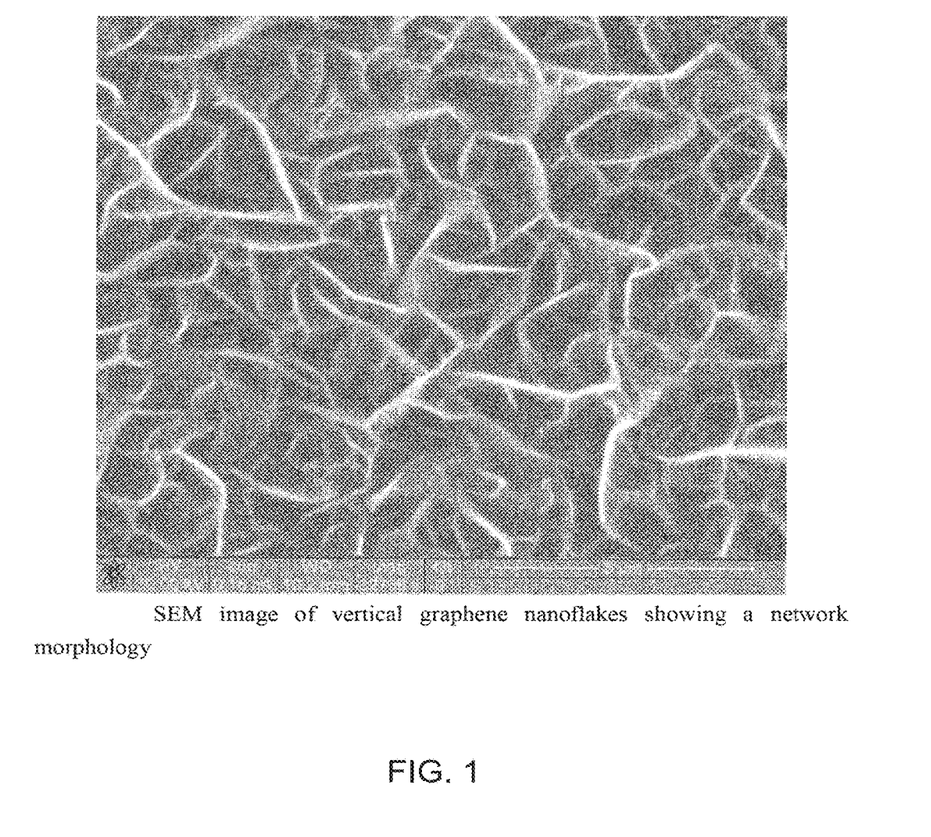
FIG. 1 shows an SEM image of vertical graphene nanoflakes showing a network morphology
Figure 2A:
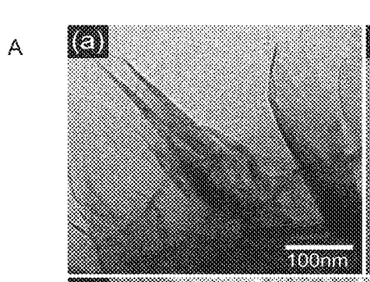
FIGS. 2A-2C show multilayer graphene nanoflakes (MGNFs) and carbon nanoflakes (CNFs).
Figure 2B:
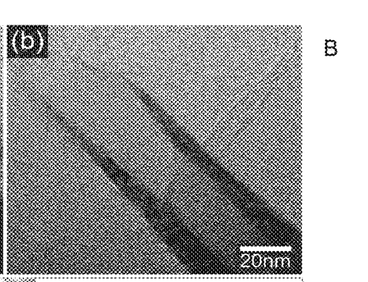
Figure 2C:
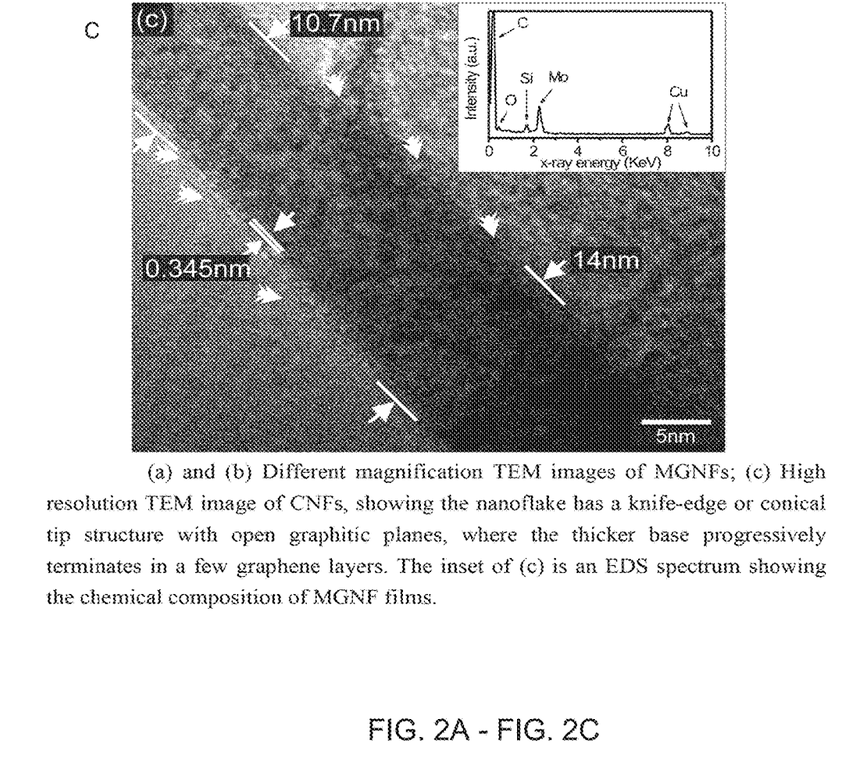

Nanowalls and nanoflakes are two-dimensional nanostructures composed of self-aligned graphene sheets lying vertically on a substrate. They have a branching, i.e. network, morphology as shown in FIG. 1. The nanoflakes are like narrow belts or bent leaves. Nanoflakes are grown vertically with respect to the substrate as confirmed by the cross sectional SEM shown in FIG. 1 (from Shang et al., *Adv Fun. Mat.* 18 (2008) 3506-3514). Each nanoflake does not have uniform thickness along its height, but has a wedge-like structure with a thicker base, which progressively decreases along its altitude terminating finally on a few graphene layers, for example as shown in TEM image of FIG. 2(c).

The silicon-doped graphene coating of the current invention comprises or consists of graphene layers (nanosheets) having a planar morphology and which are horizontally orientated with respect to the substrate as opposed to graphene nanoflakes in a network morphology which are vertically oriented with respect to the substrate.

The planar morphology of the current invention is advantageous for corrosion protection because the nanosheet edges are more easily oxidised whereas the basal plane is inactive.

Silicon-Doping

In the context of the present invention, the term "silicon-doped graphene" is used to refer to graphene, onto which silicon atoms have been chemically bound. The silicon doping is preferably not solely in the form of adsorbed silicon or silicon held by non-bonded electrostatic interactions. Preferably the silicon dopant is incorporated into the crystal lattice of the graphene nanosheet.

The term "dopant" is used to describe an impurity element which is inserted into a substance in order to alter the properties of the substance. Silicon doping of graphene is a crucial aspect of the present invention and silicon-doped graphene is intended herein in any instance where the dopant is not specified. However, the coatings of the invention may comprise additional doping materials. These include dopants such as nitrogen, sulphur, boron and phosphorous.

Silicon-Doped Graphene Coating

The coating of the invention comprises, and optionally consists of, silicon-doped graphene layers where the graphene is in the form of graphene nanosheets (as defined herein). The silicon-doped graphene may optionally also be doped with other elements as indicated herein. The coating of the invention as indicated herein in all respects may be employed in any of the indicated forms in any aspect of the invention.

The graphene layers are positioned horizontally to a surface in a formation often termed "horizontally aligned". This term is used in the art and herein to indicate the position of layers such that one surface of each layer is against a surface of the substrate. This may be the surface upon which the layers were formed. An example of a suitable surface is a metal surface.

The coatings of the invention may comprise or consist of multiple layers of single-atom-thick graphene nanosheets. A preferred number of layers is in the range 1 to 10, more preferably 1 to 5. A highly preferred number of layers is 1 to 3, for example 2 layers.

The silicon content of the silicon-doped graphene may be in the range 1 to 60 at. % (e.g. 2 to 60 at % or 5 to 60 at %), preferably in the range 5 to 50 at. %, more preferably 5 to 40 at. %, most preferably 10 to 30 at. %.

If a second hetero-atom dopant is present, preferably the total content of Si and the second hetero-atom dopant will not exceed 50 at. %, for example it may be in the range 5-30 at. %. Thus the level of second dopant, where present, may be 1 to 30 at %, preferably 1 to 15 wt % (e.g. 5 to 15 wt %). In one embodiment, the level of Si dopant is greater than the level of any optional second dopant present.

In all aspects of the invention, it is possible for the coating of the invention to further comprise a second, preferably non-metallic, heteroatom dopant. Example second dopants include phosphorous and nitrogen. Nitrogen is particularly preferred as a second dopant. When nitrogen is present as an additional dopant, it is preferable that the nitrogen is covalently bound, such as by incorporation into the crystal lattice of the oxygen-doped graphene. Methods for the formation of nitrogen-doped graphenes are known in the art. The second dopant may optionally be used in any aspect of the invention.

In all aspects of the invention, it is especially preferred if the coating is metal-free.

Preferably the silicon-doped graphene nanosheets of the invention have a single layer thickness less than 1 nm. In one aspect of the invention it is preferred if the total thickness of the coating is less than 1 nm, for example the coating may be preferably made up of 2 layers with approximate total thickness of, for example, approximately 0.7 nm. In all aspects of the invention it is preferred if the total thickness of the coating is less than 2 nm, for example less than 5 layers such as 2-4 layers, preferably 2 layers, for example 0.3-1.4 nm, preferably 0.33-0.67 nm. Preferably the single layer thickness is not less than 0.335 nm.

It is an aspect of the invention that the coatings as defined herein maintain excellent physical properties in comparison with un-doped graphene.

Preferably the coatings of the invention may have a hardness in the range of 50-150 GPa for a film of 1-10 nm thickness.

The value of Young's modulus for the coatings of the invention is preferably in the range 150-250 GPa for a film of 1-10 nm thickness.

It is an aspect of the invention that the coatings as defined herein provide improved corrosion resistance in comparison with un-doped graphene. Preferably the charge transfer resistance of the coatings of the invention can be greater than $6 \times 10^6$ Ω cm$^2$, for example greater than $1 \times 10^8$ cm$^2$, preferably greater than $4 \times 10^8$ Ω cm$^2$ or $5 \times 10^8$ Ω cm$^2$, more preferably greater than $8 \times 10^8$ Ω cm$^2$ as measured for a film of thickness 100 nm, preferably as measured for a film of thickness 3 nm. The silicon incorporation is expected to induce a lower corrosion current density and a more positive voltage (see for example, FIG. 4).

In an alternative embodiment, the charge transfer resistance is comparable to that of un-doped graphenes. In such an embodiment, the coating may have a charge transfer resistance of 2 to 3000 Ω cm$^2$, e.g. 10 to 1000 Ω cm$^2$ or 100 to 500 Ω cm$^2$. A charge transfer resistance of around 100 Ω cm$^2$, such as 50 to 200 Ω cm$^2$ would be typical in one embodiment.

Preferably the coatings of the invention have a gas permeability of less than 0.01 μm g/m$^2$ day. Particularly the coatings of the invention have a gas permeability of less than 0.005 cc/(m$^2$ day) Preferably the Water Vapour Transfer Rate (WVTR) of the coatings of the invention can be less than 0.15 g/(m$^2$ day) Particularly the coatings of the invention have a Water Vapour Transfer Rate (WVTR) of less than 10$^{-6}$ g/(m$^2$ day).

Methods of Manufacture

The process for the production of a silicon-doped graphene coating as defined herein, may comprise "one step" chemical vapour deposition (thermal CVD or microwave plasma enhanced CVD) or a "two step" process i.e. CVD growth of graphene followed by post-growth functionalisation of graphene with Si. In the "one step" process Si-doped graphene may be obtained through direct deposition. In the "two step" process a graphene layer may be grown as a first step, followed by doping with silicon by, for example, plasma treatment.

It is an aspect of the invention that the "one step" process for production of the silicon-doped graphene coatings defined herein may simultaneously produce SiC phases, or mixed SiC and Si-doped graphene coatings. Preferably the coatings produced will comprise at least 50% Si-doped graphene, more preferably at least 75%, most preferably at least 90% Si-doped graphene.

Graphene layers on a variety of polycrystalline metal substrates can be deposited by chemical vapour deposition using a range of experimental conditions.

The deposition of graphene layers has been demonstrated via thermally assisted chemical vapour deposition. A precursor such as trimethylsilane (TMS) may be used either as a sole precursor for direct growth of silicon-doped graphene or in combination with other hydrocarbons such as acetylene, methane etc. Suitable ratios of TMS to hydrocarbon (e.g. acetylene or methane) range from 1:99 to 99:1.

Post deposition silicon-doping can be achieved with numerous techniques that dissociate the TMS precursor, for example RF plasma glow discharge, atmospheric plasma, electron, cyclotron resonance etc.

Silane (SiH$_4$) gas can also be used as silicon precursor during deposition or post deposition plasma treatment at room temperature or at a higher temperature. The choice of precursor may affect the resulting bonding configurations on graphene.

Preferably the substrate used is a metal. Preferred metals include Cu and Ni.

In one embodiment, a copper substrate coated with the silicon doped graphene coating of the present invention exhibits a corrosion potential (Ecorr) of −0.25V or greater (less negative) when compared to a standard Ag/AgCl reference electrode. Preferably a copper substrate coated with the silicon doped graphene coating of the present invention exhibits a corrosion potential (Ecorr) which is less negative than that of clean or annealed uncoated copper.

Method of Inhibiting Corrosion

In one aspect the invention provides a method for inhibiting corrosion of a metal comprising forming a coating as defined herein on a portion of the surface of said metal. Preferably at least 50%, preferably at least 80%, more preferably at least 95%, of the surface area of the metal is coated. Most preferably at least 99% of the surface area of the metal is coated. It is particularly preferred if the coating covers essentially all the surface of the metal except for pinholes and cracks.

Use in Reduction of Corrosion

The invention further provides for the use of silicon-doped graphene as a coating for the reduction of corrosion, preferably oxidative corrosion, at the surface of a metal. Preferably the coating used is as defined herein. Oxidative corrosion is defined as corrosion due to oxidation of the substrate.

BRIEF DESCRIPTION OF FIGURES

FIGS. 2(a) and 2(b) are different magnification TEM images of MGNFs. FIG. 2(c) is a high resolution TEM image of CNFs, showing the nanoflake has a knife-edge or conical tip structure with open graphitic planes. The inset of FIG. 2(c) is an EDS (energy dispersive x-ray spectroscopy) spectrum showing the chemical composition of MGNF films.

EXAMPLES

In this work we have examined the behaviour of bare copper, annealed copper, graphene coated copper and Si incorporated copper in saline solution as well as after exposure to air at elevated temperature of 200° C. for 1 hour.

Sample Preparation

A SEKI Technotron ECR-MPCVD system (2.45 GHz, 1.5 KW), was used to deposit Si incorporated graphene films. Briefly the system was pumped down to base pressure of 2.8 10-5 Torr and was operated in ECR mode. Cu foils 25 μm thick (99.999%, Alfa Aesar No. 10950) were initially etched for 3-4 minutes at room temperature in an Ar plasma using microwave power of 100 W. Then the temperature was raised to approximately 900° C. and the samples are heated in a background pressure of 40 Torr of $N_2$.

Graphene and silicon incorporated graphene were synthesised in a gas mixture of methane and argon and TMS (tetramethylsilane-Si$(CH_3)_4$ with gas flow rates of 6, 3 and 0 to 10 sccm (standard cubic centimeters per minute) respectively. Deposition was carried out on the pre-heated Cu foils at a gas composition pressure of 7.5 $10^{-4}$-17 $10^{-4}$ Torr for a duration of 90 sec at a microwave power of 100 W.

Corrosion resistance is profoundly influenced by the microstructure of the metal as well the presence of native oxide. The native oxide of copper was mechanically removed with SiC paper and cleaned in ultrasonic bath of acetone and ethanol (termed "cleaned"). Samples termed "annealed" were subjected in all the steps required for graphene deposition, without been coated.

Electrochemical Tests

Electrochemical measurements were carried out by using a self-made 10 mL cylinder cell with three electrodes (specimens with an exposed area of 0.196 $cm^2$ acted as the working electrode, platinum wire as counter electrode and a Ag/AgCl electrode as the reference electrode). Potentiodynamic polarization and electrochemical impedance spectroscopy (EIS) were performed in 0.1 M sodium chloride (NaCl) solution using an Autolab potentiostat.

All the experiments were performed at room temperature. Open circuit potential was monitored for 1 h to confirm its stability with time. Any fluctuation of the open circuit potential less than 10 mV for a period of 1000 s was considered as a stable potential before carrying out the corrosion tests. Potentiodynamic polarization tests were carried out at a scan rate of 0.5 mV/s. The impedance tests were carried out by applying a sinusoidal potential wave at Open Circuit Potential OPC with an amplitude of 10 mV Impedance response was measured over frequencies between 1 MHz and 10-2 Hz, at open circuit potential.

We employ optical micrographs as one diagnostic for degree of oxidation; oxide films of increasing thickness lead to optical interference effects and pronounced color changes.

Results and Discussion

Figure 3:
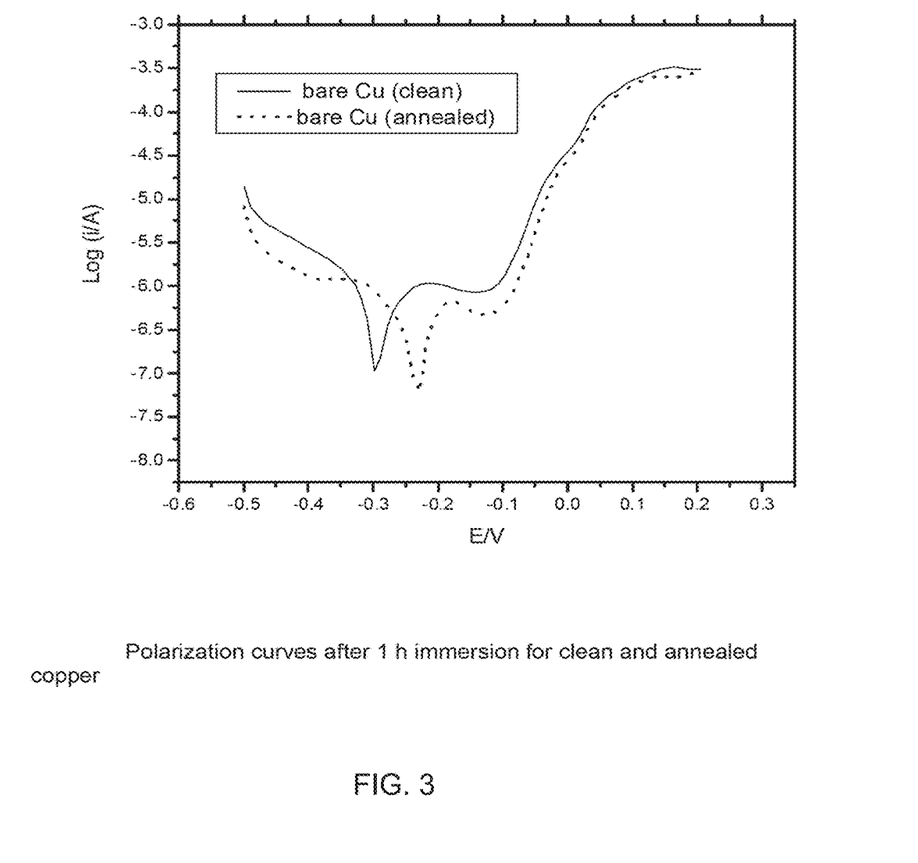
FIG. 3. shows polarization curves after 1 h immersion for clean and annealed copper
Figure 4:
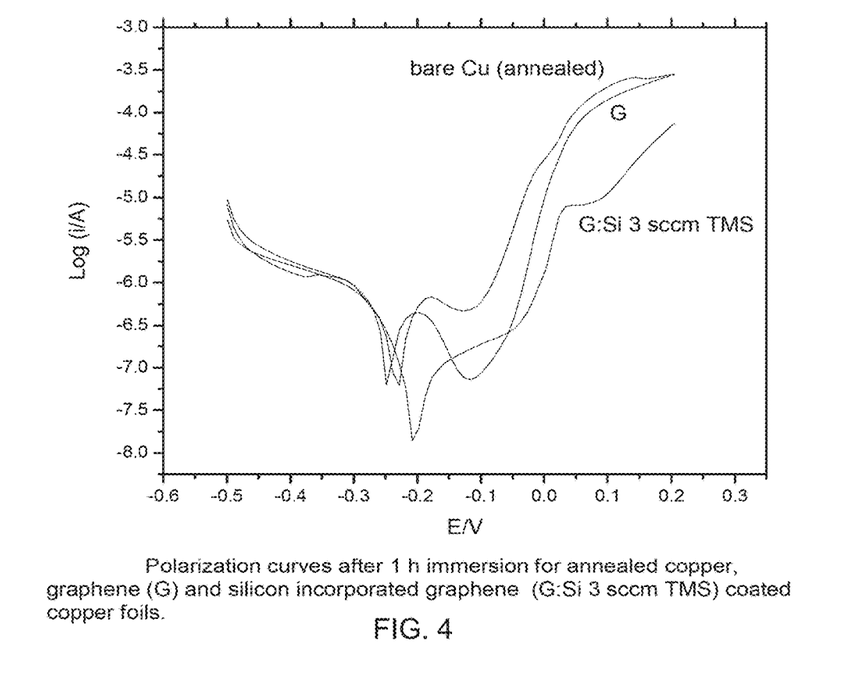
FIG. 4 shows polarization curves after 1 h immersion for annealed copper, graphene (G) and silicon incorporated graphene (G:Si 3 sccm TMS) coated copper foils.

Polarization curve (FIG. 3) shows more positive Ecorr, corrosion potential value and lower current densities in both anodic and cathodic regions for the annealed copper, which implies a higher corrosion resistance. The role of graphene and silicon incorporating graphene coating in suppressing Cu corrosion is shown in FIG. 4. It is clear that silicon incorporation (3 sccm TMS during deposition) causes a positive shift on the Ecorr and a marked decrease in the anodic current densities, compared to pure graphene, which is further enhanced at higher TMS flow rates.

Figure 5:
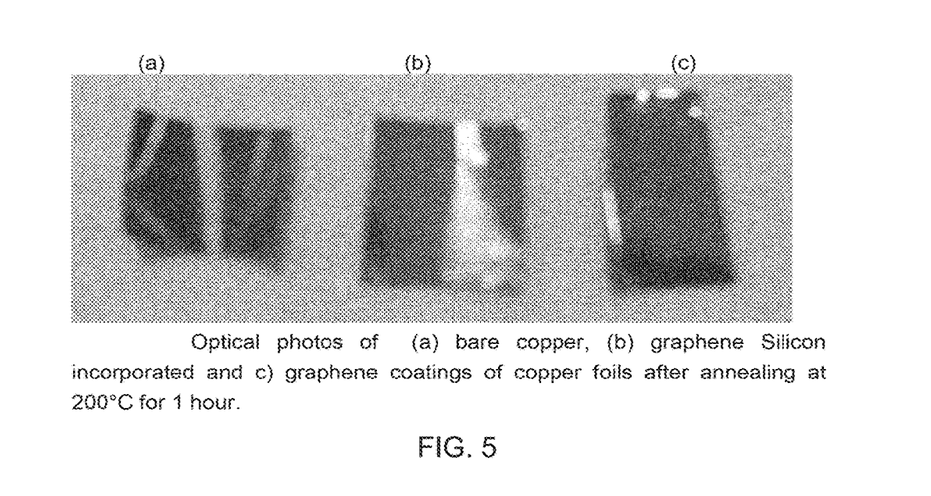
FIG. 5 shows optical photos of (a) bare copper, (b) graphene with silicon incorporated and c) graphene coatings of copper foils after annealing at 200° C. for 1 hour.
Figure 6A:
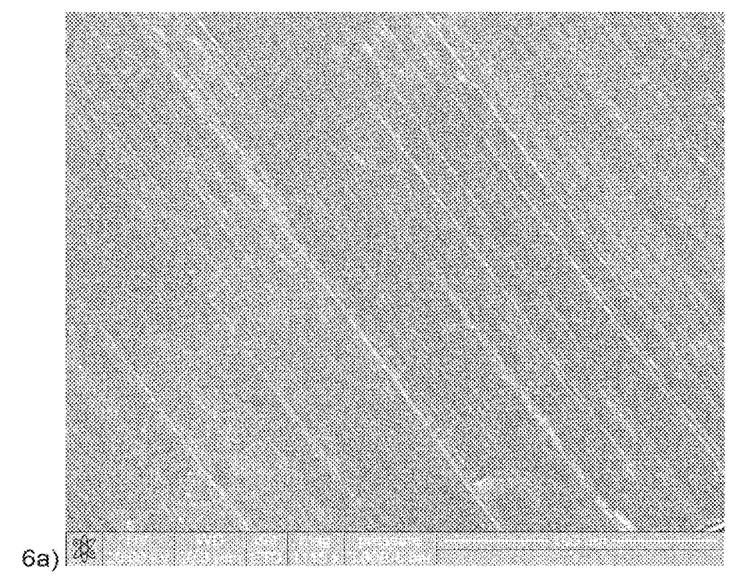
FIGS. 6A-6C show SEM images of (a) bare Cu foil after annealing at 200° C. for 1 hour (b) Silicon doped graphene on copper foil before annealing and (c) Silicon doped graphene on cupper foil after annealing at 200° C. for 1 hour FIG. 7. shows raman spectra of (a) graphene and (b) Silicon incorporated graphene coated on Cupper before and after annealing in air at 200° C. for 1 hour
Figure 6B:
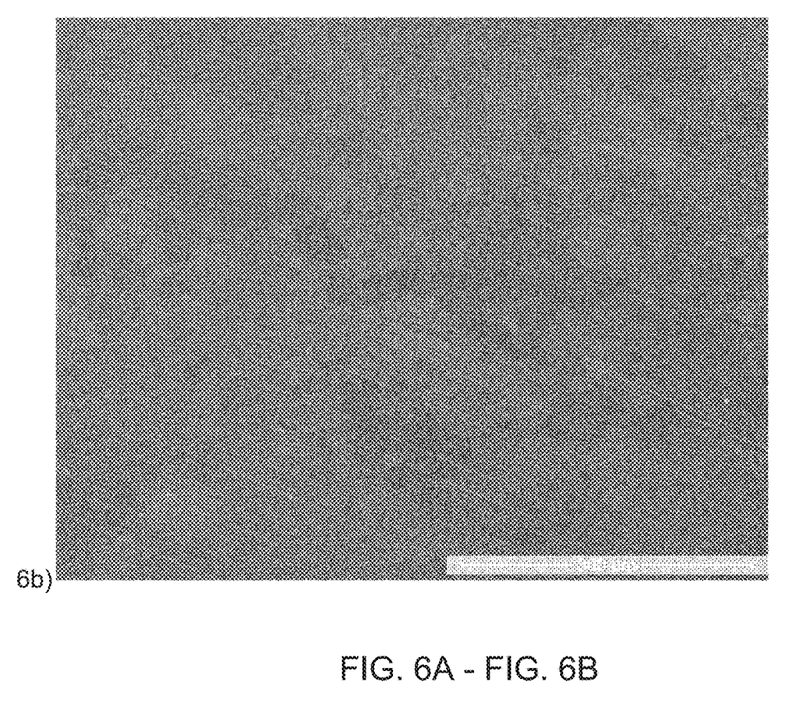
Figure 6C:
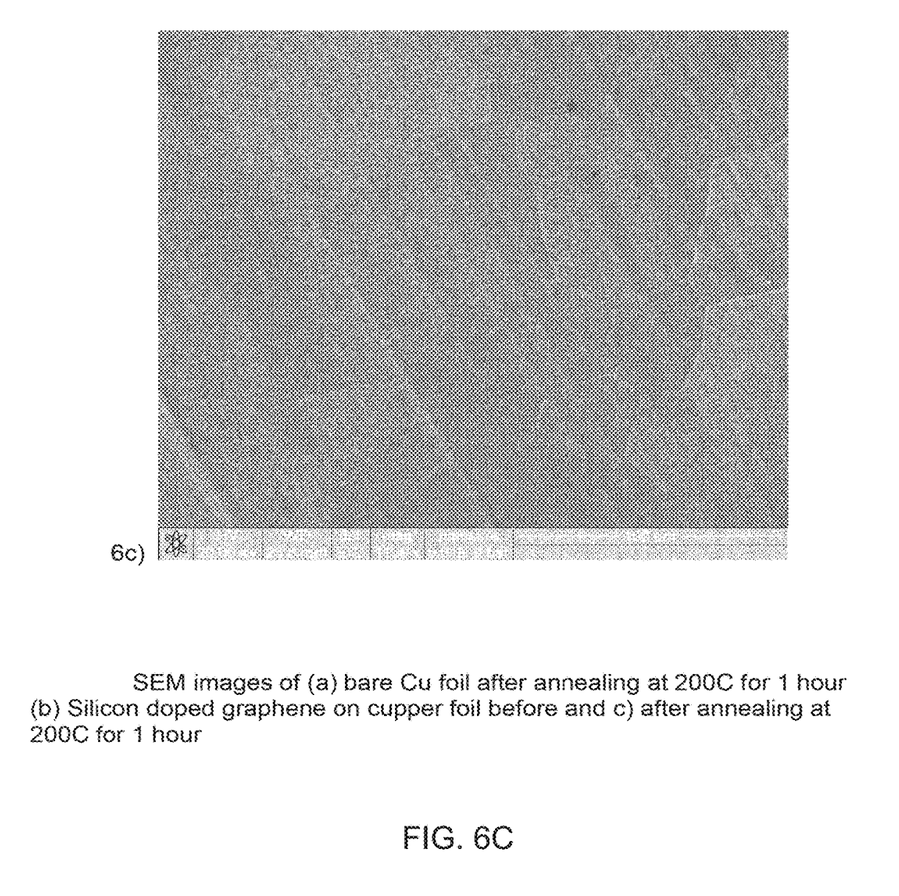
Figure 7:
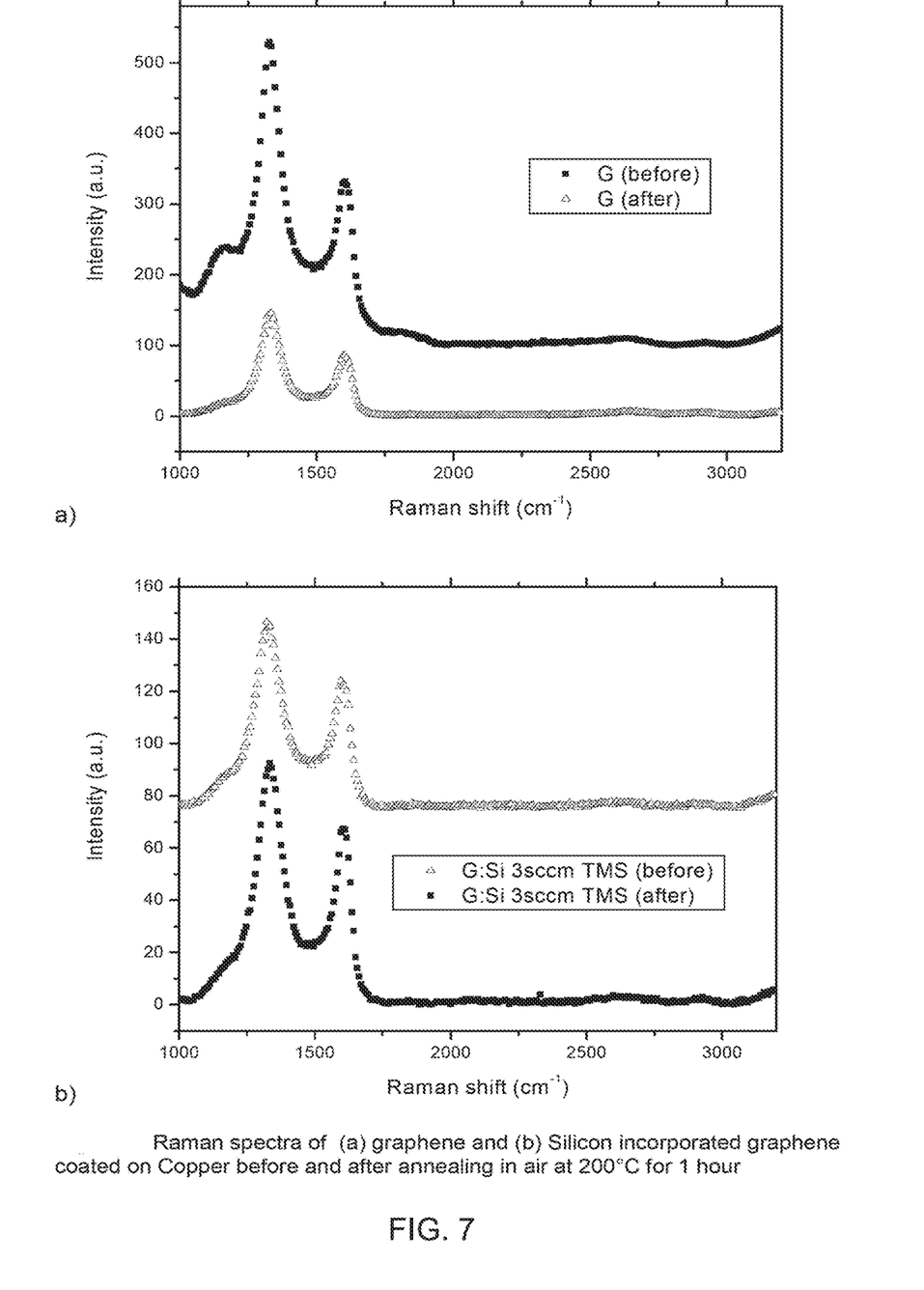

FIG. 5 shows photograph images of Cu foil surface, graphene coating, and silicon incorporated graphene coatings after annealing in air at 200° C. for 1 hour. Before annealing, the surface colours of bare copper, graphene and silicon incorporated graphene coated Cu foils are almost similar as the graphene film is highly transparent. After annealing in atmospheric air, the uncoated Cu surface changes significantly to red due to significant oxidation of copper. The change of surface colour of Silicon incorporated graphene coated Cu foil is negligible whereas that of graphene rather more noticeable, which indicates that silicon incorporation creates a greater diffusion barrier to prevent oxidation. In addition no significant change was observed in the SEM images (FIG. 6) as well as Raman spectra of the graphene and silicon incorporated graphene before and after annealing in air as revealed in FIG. 7.

Figure 8A:
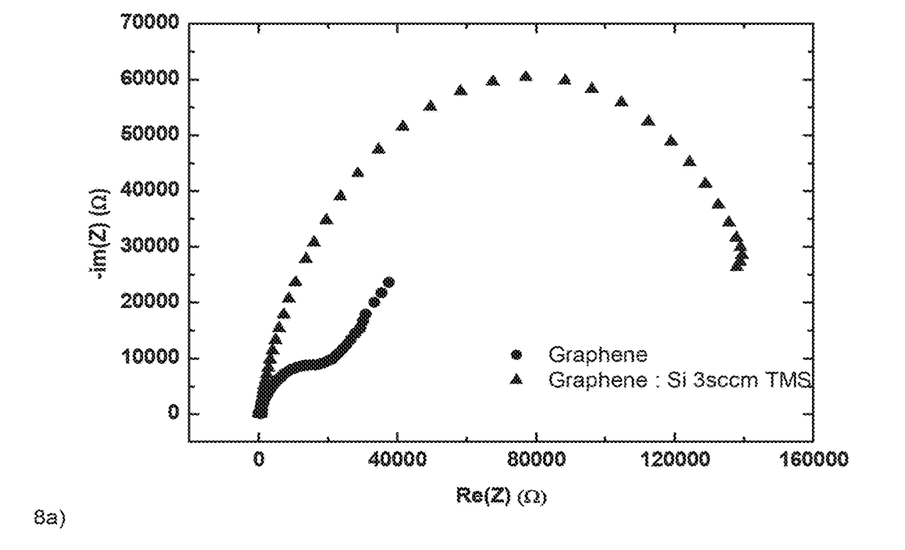
FIGS. 8A-8C show impedance (8a), Nyquist (8b) and Bode (8c) plots of graphene and Silicon incorporated graphene coated on Copper foil
Figure 8B:
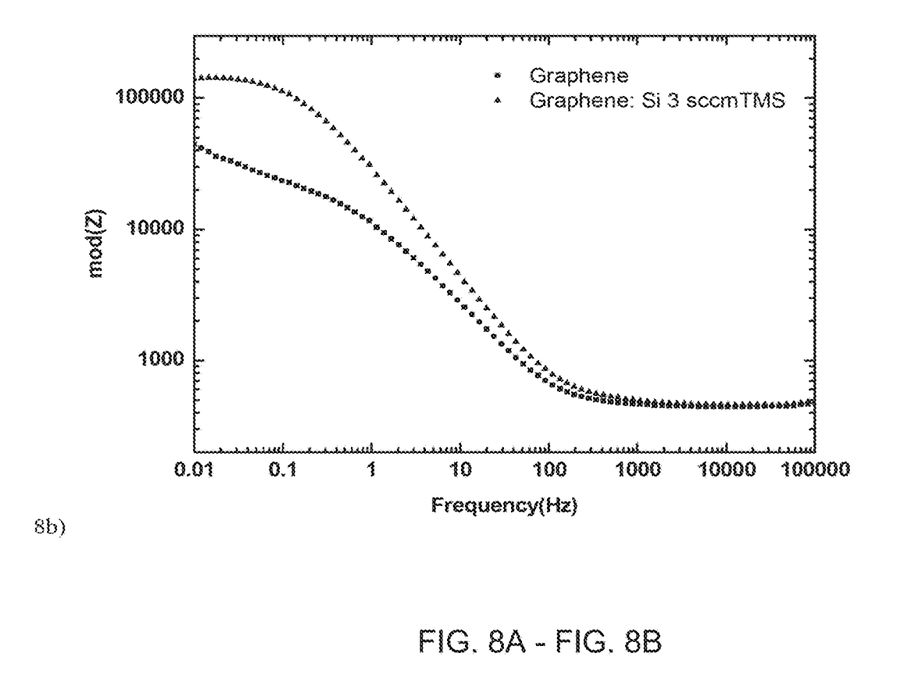
Figure 8C:
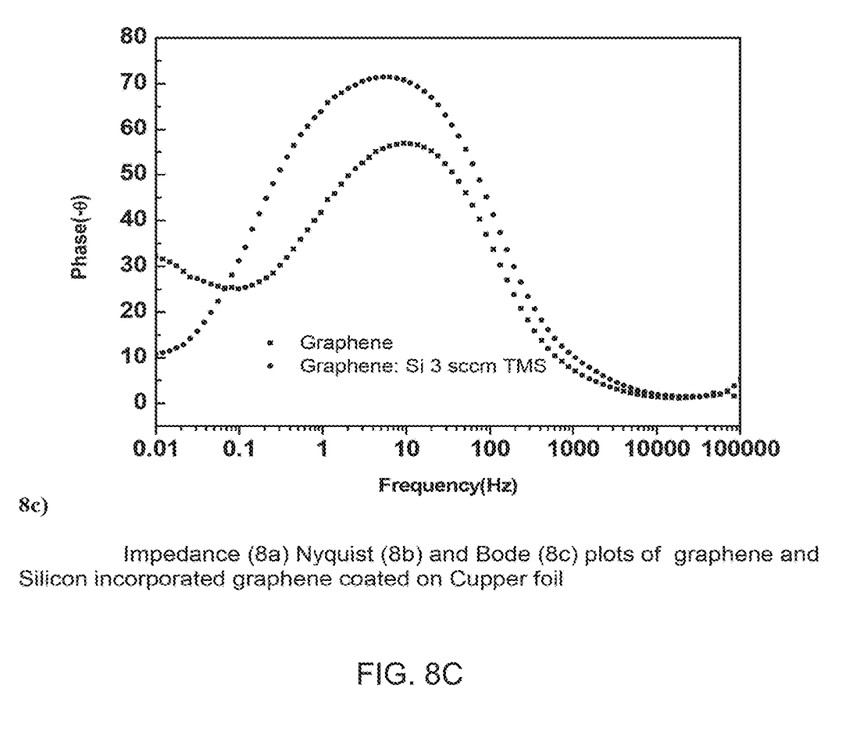

FIG. 8 shows Nyquist plot (Zreal vs. −Zimg) and Bode magnitude plot (|Z| vs. log of freuencency) and phase plots for a graphene and silicon incorporated graphene coated cupper. The figures demonstrate that Silicon incorporation increases the impendence of graphene. Therefore the improved corrosion resistance of Silicon incorporated graphene coating can be attributed to its enhanced charged transfer resistance.

The invention claimed is:

1. A coating comprising silicon-doped graphene layers wherein the graphene is in the form of horizontally-aligned graphene nanosheets, and wherein the silicon content of the silicon-doped graphene is in the range 2 to 60 at %.

2. The coating as claimed in claim 1 wherein the graphene nanosheets have planar morphology.

3. The coating as claimed in claim 1, wherein the coating comprises or consists of a single monoatomic layer of silicon-doped graphene nanosheets.

4. The coating as claimed in claim 1 having a single-layer thickness in the range of 0.3 to 0.9 nm.

5. The coating as claimed in claim 1 having a total thickness in the range of 0.3 to 1.9 nm.

6. The coating as claimed in claim 1, wherein the silicon and/or second heteroatom are incorporated into the crystal lattice of the graphene.

7. The coating as claimed in claim 1, wherein the coating is metal-free.

8. The coating as claimed in claim 1, wherein said coating covers at least 50% of the surface area of the substrate.

9. The coating as claimed in claim 1, wherein said coating has a charge transfer resistance greater than 20 Ω $cm^2$.

10. The coating as claimed in claim 1, wherein said coating covers at least 80% of the surface area of the substrate.

11. The coating as claimed in claim 1, wherein said coating covers at least 95% of the surface area of the substrate.

12. The coating as claimed in claim 1, wherein said coating covers at least 99% of the surface area of the substrate.

13. The coating as claimed in claim 1, wherein the coating comprises or consists of multiple layers of silicon-doped graphene nanosheets.

14. The coating as claimed in claim 13, wherein the number of layers is in the range 1 to 10.

15. The coating as claimed in claim 13, wherein the number of layers is in the range 1 to 5.

16. The coating as claimed in claim 1, further comprising a second, non-metallic heteroatom dopant, which is not oxygen.

17. The coating as claimed in claim 16 wherein the second heteroatom is nitrogen.

18. A coated metal wherein at least a portion of the metal surface comprises a silicon-doped graphene coating as defined in claim 1.

19. The coated metal as claimed in claim 18, wherein at least 50% the metal is coated.

20. The coated metal as claimed in claim 18, wherein at least 80% of the surface area of the metal is coated.

21. The coated metal as claimed in claim 18, wherein at least 95% of the surface area of the metal is coated.

22. The coated metal as claimed in claim 18, wherein at least 99% of the surface area of the metal is coated.

* * * * *